United States Patent
Ina

(10) Patent No.: US 7,043,750 B2
(45) Date of Patent: May 9, 2006

(54) SET-TOP BOX WITH OUT-OF BAND MODEM AND CABLE MODEM

(75) Inventor: Norihisa Ina, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1036 days.

(21) Appl. No.: 09/815,100

(22) Filed: Mar. 22, 2001

(65) Prior Publication Data

US 2002/0083466 A1 Jun. 27, 2002

Related U.S. Application Data

(60) Provisional application No. 60/197,848, filed on Apr. 14, 2000, provisional application No. 60/197,310, filed on Apr. 14, 2000, provisional application No. 60/197,308, filed on Apr. 14, 2000, provisional application No. 60/197,233, filed on Apr. 14, 2000, provisional application No. 60/197,234, filed on Apr. 14, 2000, provisional application No. 60/197,320, filed on Apr. 14, 2000.

(51) Int. Cl.
*H04N 7/173* (2006.01)

(52) U.S. Cl. ...................................... 725/131; 725/151

(58) Field of Classification Search ................ 725/111, 725/110, 131, 151
See application file for complete search history.

(56) References Cited

U.S. PATENT DOCUMENTS

| | | | | | |
|---|---|---|---|---|---|
| 4,520,507 | A | * | 5/1985 | Moon | 725/151 |
| 5,898,900 | A | * | 4/1999 | Richter et al. | 725/70 |
| 6,305,019 | B1 | * | 10/2001 | Dyer et al. | 725/91 |
| 6,343,315 | B1 | * | 1/2002 | Stoel et al. | 709/204 |
| 6,363,262 | B1 | * | 3/2002 | McNicol | 455/561 |
| 6,757,909 | B1 | * | 6/2004 | Maruo et al. | 725/111 |

* cited by examiner

*Primary Examiner*—Vivek Srivastava
*Assistant Examiner*—James Sheleheda
(74) *Attorney, Agent, or Firm*—Miller Patent Services; Jerry A. Miller

(57) ABSTRACT

A circuit arrangement for combining signals in a cable set-top box or television receiver. An out-of-band upstream amplifier and a cable modem upstream amplifier have their outputs combined at a combiner before being passed to the cable through a diplexer. The output of the diplexer provides incoming signals for an in-band tuner, a cable modem tuner and an out-of-band tuner that can be passed through a low noise amplifier before passing through a three-way splitter to divide the signals to each of the tuners.

18 Claims, 3 Drawing Sheets

SET-TOP BOX WITH OUT-OF BAND MODEM AND CABLE MODEM

CROSS REFERENCE TO RELATED DOCUMENTS

This application is related to and claims priority benefit under 35 U.S.C. § 119(e) or 35 U.S.C. § 120 of Provisional Patent Application 60/197,310, filed Apr. 14, 2000, 60/197,848filed Apr. 14, 2000, and entitled "User Interface for a Set-Top Box", Provisional Patent Application 60/197,308, filed Apr. 14, 2000, and entitled "Method for VOD", Provisional Patent Application 60/197,233, filed Apr. 14, 2000, and entitled "Cable Modem Set Top Box", Provisional Patent Application 60/197,234, filed Apr. 14, 2000, and entitled "Web Based EPG Support", and Provisional Patent Application 60/197,320, filed Apr. 14, 2000, and entitled "Support for tuning while viewing a Web Based EPG", and U.S. patent application Ser. No. 09/775,692 filed Feb. 3, 2001 entitled "Web Browser Plug in for TV" Kimble et al. which are each hereby incorporated by reference. U.S. patent application Ser. No. 09/473,625, filed Dec. 29, 1999, entitled "Improved Internet Set-Top Box Having and In-Band Tuner and Cable Modem" is also hereby incorporated herein by reference.

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

FIELD OF THE INVENTION

This invention relates generally to the field of cable television set-top boxes. More particularly, this invention relates to a television set-top box with both DAVIC and DOCSIS compatibility using dual modems.

BACKGROUND OF THE INVENTION

Recently, cable television systems have begun providing numerous enhanced services to their subscribers. In order to provide those services, the cable system is used to transport data both upstream and downstream along with television signals. Such signals are transmitted in frequency ranges ranging from, currently, 5 Mhz to 860 Mhz. Moreover, the standardized signals and frequency ranges have a significant amount of overlap. TABLE 1 below illustrates the frequency ranges commonly used in a cable system for television programming as well as associated and unassociated data communications.

TABLE 1

| DEVICE | FREQUENCY RANGE |
| --- | --- |
| In-band tuner for Television Programming | 54 Mhz to 860 Mhz |
| Out-of-band tuner for Data | 70 Mhz to 130 Mhz |
| Out-of-band Upstream Transmitter for Data | 5 Mhz to 42 Mhz |
| Cable Modem Tuner for Data | 88 Mhz to 860 Mhz |
| Cable Modem Upstream Transmitter for Data | 5 Mhz to 42 Mhz |

In designing a television system or set-top box system that accommodates each of the signals in TABLE 1, a major challenge is to minimize insertion loss for signals coming downstream from the cable head end and destined for the tuners while simultaneously minimizing the upstream insertion loss for the upstream data with appropriate isolation of the signals. If the insertion loss from cable to tuner is too great, the sensitivity of the set-top box (or television) may be degraded and cause problems with data error or picture and sound quality. If insertion loss is too great in the upstream path to the cable, higher output power amplifiers may be required with a substantial amount of energy being dissipated as losses before the output signal reaches the cable. This results in wasted energy and increased cost of the set-top box.

SUMMARY OF THE INVENTION

The present invention relates generally to an arrangement for combing signals in a television receiver or set-top box having dual data modems. Objects, advantages and features of the invention will become apparent to those skilled in the art upon consideration of the following detailed description of the invention.

In one embodiment of the present invention, an apparatus for combining signals in a cable set-top box is provided. An out-of-band upstream amplifier and a cable modem upstream amplifier have their outputs combined at a combiner before being passed to the cable through a diplexer. The output of the diplexer provides incoming signals for an in-band tuner, a cable modem tuner and an out-of-band tuner that can be passed through a low noise amplifier before passing through a three-way splitter arrangement to divide the signals to each of the tuners.

An apparatus for combining upstream and downstream signals in a television set-top box, consistent with an embodiment of the invention, includes a cable interface interfacing to a cable television cable. A diplexer is coupled to the television cable interface at a diplexer port, the diplexer having a diplexer input for receiving upstream signals and a diplexer output for providing downstream signals. A combiner has an output coupled to the diplexer input, and a first input receiving a first output from a first upstream modem output, and a second input receiving a second output from a second upstream modem output. A splitter has an input coupled to the diplexer output, and a first output providing signals to a first tuner, and a second output providing signals to a second tuner, and a third output providing signals to a third tuner.

The above summaries are intended to illustrate exemplary embodiments of the invention, which will be best understood in conjunction with the detailed description to follow, and are not intended to limit the scope of the appended claims.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
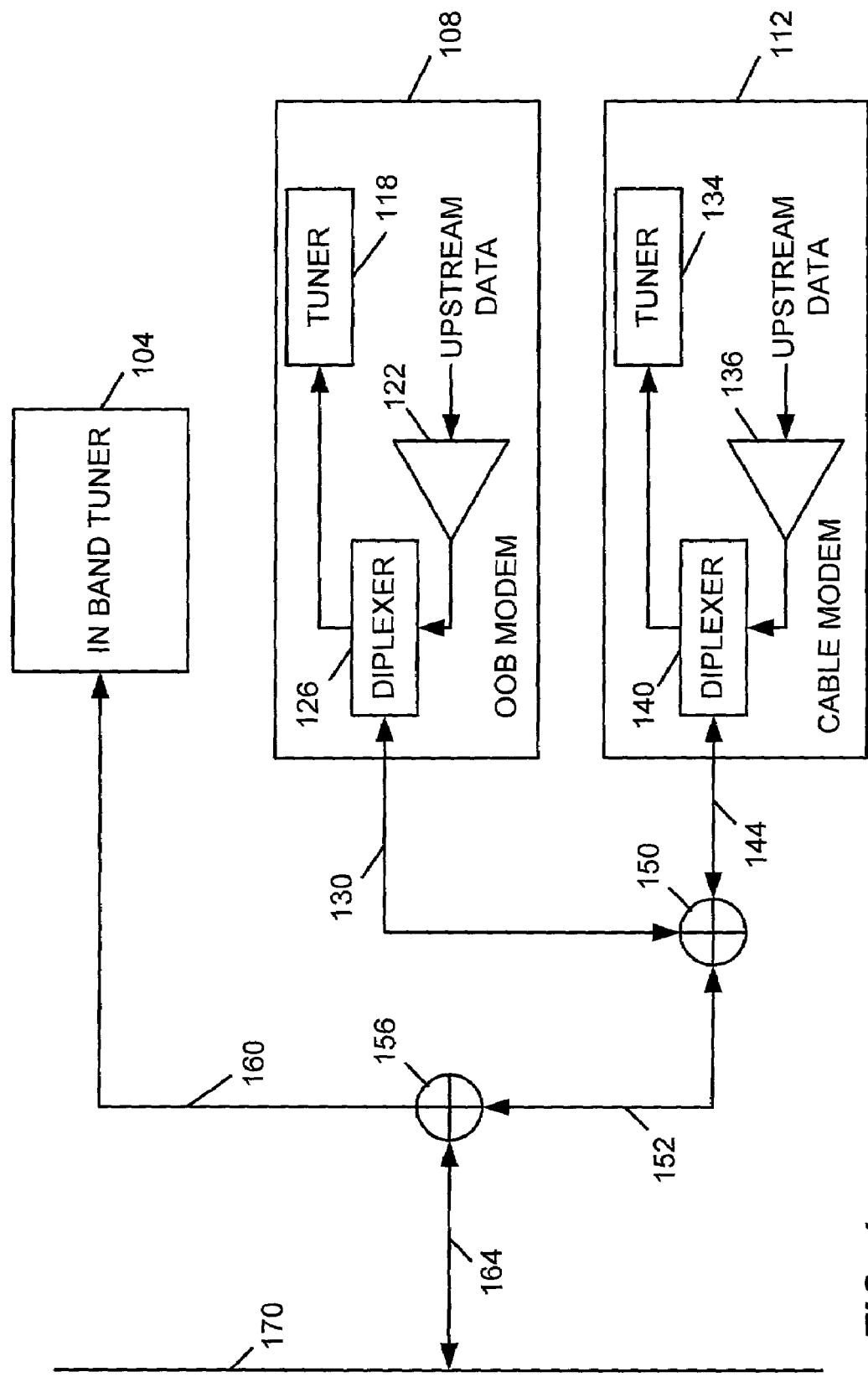
FIG. 1 illustrates an arrangement for combining signals for modems and television signals.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring now to FIG. 1, a television set-top box may include a circuit arrangement such as that depicted as 100 including an in-band tuner 104 for television signals, an out-of-band modem 108 and a cable modem 112. Since the out-of-band modem 108 is conventionally thought of as a single device incorporating an out-of-band tuner (receiver) 118 and an out-of-band transmitter including an amplifier 122, they are often designed as such with downstream data to the out-of-band tuner 118 being combined with the upstream data from amplifier 122 using a diplexer 126. Upstream and downstream data are thus both present on the diplexer 126 output at 130. Similarly, a cable modem tuner (receiver) 134 and its associated upstream data amplifier 136 are generally thought of as a cable modem 112 and designed as such with the tuner and upstream data circuitry coupled together with a diplexer 140 so that both upstream and downstream data are present at node 144 (the output of diplexer 140). Modem modules such as 108 and 112 are commercially available from Toshiba Corporation of Japan for the express purpose of providing such functions. Such modular components as modem 108 and modem 112 can be used in conjunction with one another by combining their signals with a combiner 150 to produce a combined modem path at 152. The signals at 152 can further be combined with a combiner 156 to couple to in-band tuner 104 at an input 160. Thus, all five signals can be combined and appear at the combiner port 164 that can be connected to the cable system 170.

While the above system can be devised quickly using off the shelf components, an inefficient design results. Generally speaking, the losses associated with combiners 150 and 156 are approximately 4 dB using conventional combiner circuitry. Similarly, a diplexer such as 126 and 140 each generally results in a loss of approximately 2 dB. Thus, from cable 170 to tuner 118 or tuner 134, approximately 10 dB of insertion loss is encountered. Such a loss generally suggests that the sensitivity of tuners 118 and 134 must be very high in order to compensate for the losses without performance degradation. Thus, the design constraints on tuner 104 and tuner 134 may be quite stringent in order to use the design of FIG. 1. Similarly, amplifiers 122 and 136 encounter approximately 10 dB of losses before their output signal is supplied to cable 170. Thus, for a given signal strength required at cable 170, amplifiers 122 and 136 should produce a signal approximately 10 dB higher. This also places greater constraints on the design of amplifiers 122 and 136 in order to meet a given specification. Moreover, these constraints on tuners 118 and 134 and amplifiers 122 and 136 result in wasted energy in a set-top box which may ultimately have impact on design constraints for power supply and heat dissipation.

Figure 2:
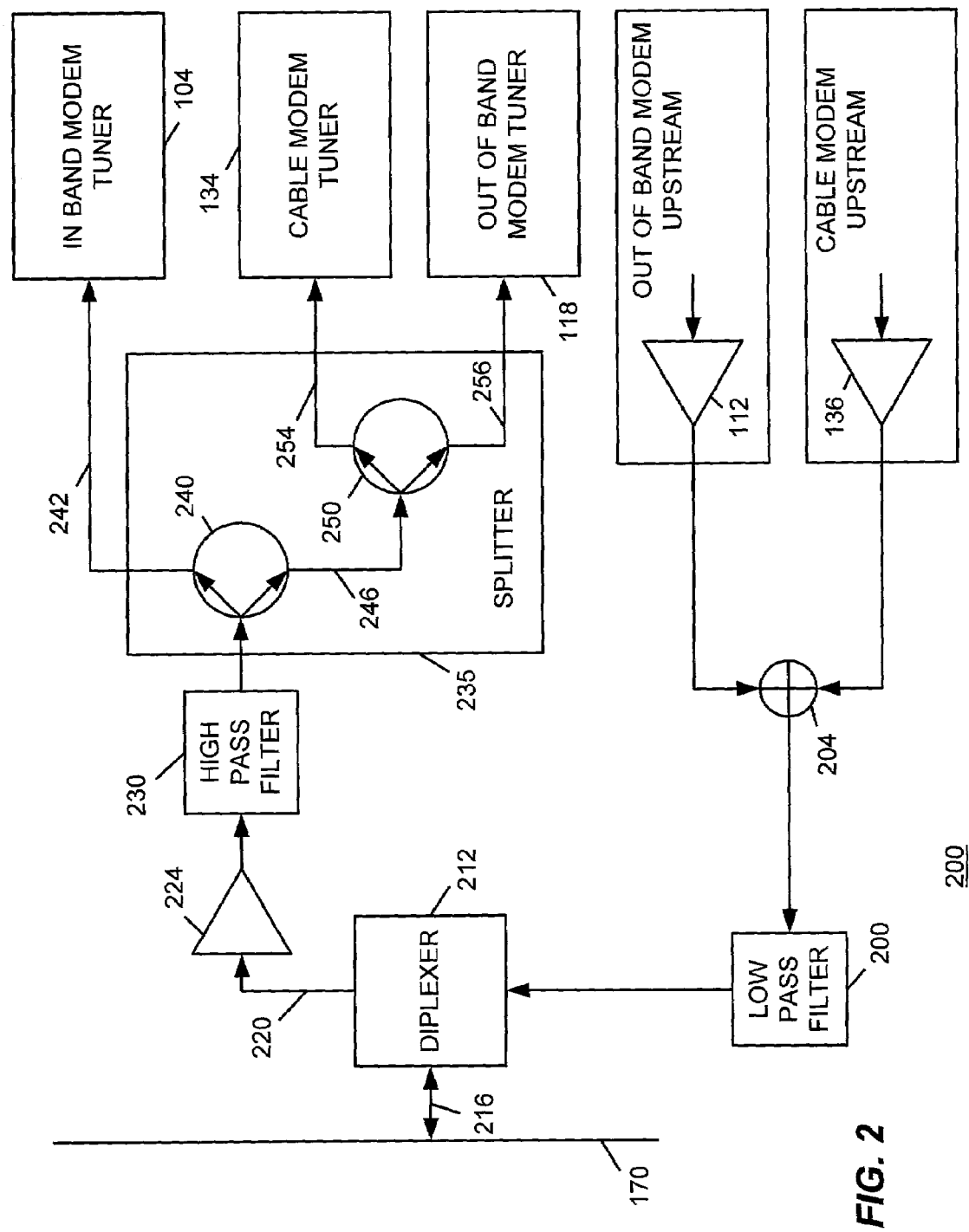
FIG. 2 is an illustration of an improved arrangement for combining signals for modems and television signals consistent with an embodiment of the present invention.

Referring now to FIG. 2, a circuit arrangement 200 can be utilized to couple the five upstream and downstream signals out of and into a set-top box (or other television receiver device) minimizing the problems associated with circuit 100. In the present invention, the out-of-band modem is used for DAVIC data while the cable modem is used for DOCSIS data. In this arrangement, each of the tuners and upstream amplifiers are treated as separate entities without regard for the association of inbound and outbound data. Considering first the upstream data paths, the out-of-band amplifier 112 and the cable modem upstream amplifier 136 provide their output signals to a combiner 204. This combiner provides its output to a low pass filter 208 (in the preferred embodiment) and then to diplexer 212 where it is passed on to the cable 170 at an output 216 of the diplexer. In this arrangement, the out-of-band upstream amplifier 112 as well as the cable modem upstream amplifier 136 encounters only the losses associated with combiner 204, low pass filter 208 and diplexer 212 before reaching the cable 170. Ignoring the loss of the low pass filter (which may be negligible in the pass band) a loss of approximately 4 dB in combiner 204 plus approximately 2 dB loss in diplexer 212 results in only approximately 6dB loss between amplifiers 112 and 136 and the cable 170. This is an approximately 4 dB improvement over the circuit arrangement 100 previously described.

In the downstream direction, the output 220 of diplexer 212 can be immediately applied to a low-noise wide-band amplifier 224. Thus, after encountering only approximately 2 dB of loss in the diplexer 212, amplifier 224 can be used to restore such loss as well as further losses encountered prior to reaching the tuners 104, 118 and 134. Moreover, by using a low-noise amplifier at 224, the noise figure of each of the tuners can be dominated by that of amplifier 224 to effectively minimize the losses after amplifier 224. The output of amplifier 224 can be provided to a high-pass filter (in the preferred embodiment) 230 which, in turn, passes its output to a splitter 235. Splitter 235 provides three outputs, one for each of tuners 104, 134 and 118. In one embodiment, two two-way splitters are utilized to build a three-way splitter by providing the output high-pass filter 230 to a first two-way splitter 240 that provides an output 242 to the in-band tuner 104 and another output 246 to a second splitter 250. Splitter 250 has two outputs,254 and 256, that are provided to cable modem tuner 134 and out-of-band tuner 118 respectively.

Using this arrangement, an attenuation of approximately 4 dB plus any minor losses in the high-pass filter 230 are encountered between the output of amplifier 224 and the in-band tuner 104. However, as previously mentioned, amplifier 224 can be used to restore the signal level and to dominate the noise figure. In the cases of out-of-band tuner 118 and cable modem tuner 134, a total of approximately 8 dB of signal loss is encountered (ignoring the loss of high pass filter 230) between amplifier 224 and the input of each of tuners 118 and 134. However, again as previously mentioned, amplifier 224 can restore a large measure of the signal level associated with each of the signals being applied to out-of-band tuner 118 and cable modem tuner 134. In the preferred embodiment, an amplifier 224 having abut 10 db of gain from 54 Mhz to 860 Mhz and about a 4 db noise figure is used, but this is not to be considered limiting. Thus, the arrangement shown in FIG. 2 can be utilized (with or without filters 208 and 230) to provide approximately 8 dB of improvement in the downstream insertion loss and 4 dB improvement in the upstream insertion loss. In other embodiments, amplifier 224 can be omitted (as can possibly high pass filter 230). In this embodiment, the in-band tuner will encounter the approximately 2 dB loss from diplexer 212 plus approximately 3 dB loss in splitter 240 for a total of about 5 dB of loss (a 5 dB improvement over circuit 100.) Similarly, the cable modem tuner 134 and out-of-band tuner 118 encounter the diplexer loss of approximately 2 dB plus approximately 3 dB for each of splitters 240 and 250 for a total of about 8 dB of loss (a 2 dB improvement over circuit 100.)

Figure 3:
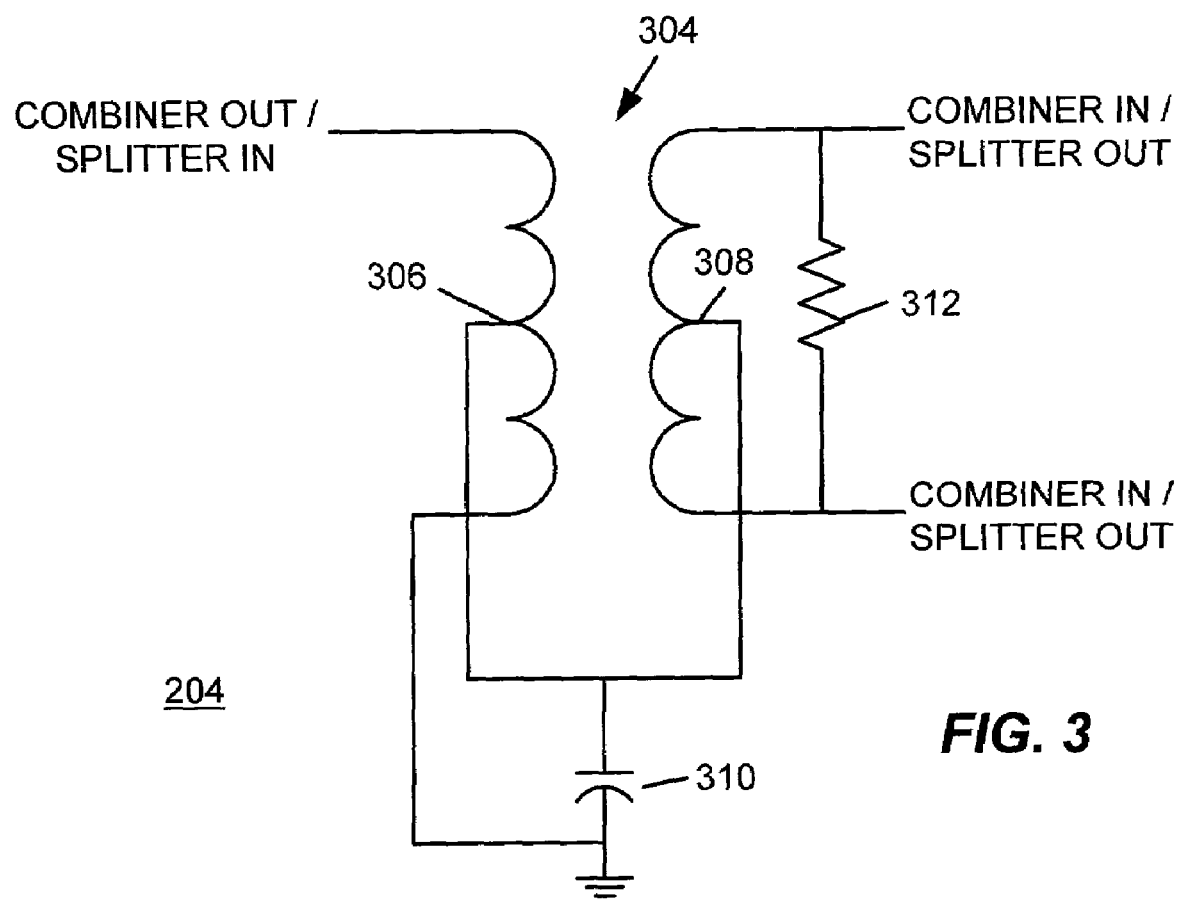
FIG. 3 illustrates an exemplary signal combiner or splitter.

FIG. 3 illustrates a combiner or splitter 300 suitable for use as combiner 204 or splitter 240 or 250 of the present invention. The combiner 300 of FIG. 3 is of conventional design with a transformer 304 having center taps 306 and 308 coupled through a capacitor 310 to ground. A resistor 312 is placed across one set of windings for impedance matching purposes with one side of the winding providing a first input for a combiner (or output for a splitter) and the other side of the winding providing a combiner second input (or output for a splitter). At the combiner output side (or splitter input side) the combiner output (or splitter input) is taken across the transformer windings with one side coupled to ground. Other combiner and splitter circuits may also be suitable for use in accordance with the present invention.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. An apparatus for combining upstream and downstream signals in a television set-top box, comprising:
   a cable interface interfacing to a cable television cable;
   a diplexer coupled to the television cable interface at a diplexer port, the diplexer having a diplexer input for receiving upstream signals and a diplexer output for providing downstream signals;
   a combiner having an output coupled to the diplexer input, and having a first input receiving a first output from a first upstream modem output, and having a second input receiving a second output from a second upstream modem output;
   wherein the first upstream modem output comprises an out-of-band modem output, and wherein the second upstream modem output comprises a cable modem output;
   a splitter having an input coupled to the diplexer output, and having a first output providing signals to a first tuner, and having a second output providing signals to a second tuner, and having a third output providing signals to a third tuner, wherein the first tuner comprises an inband tuner for tuning television programming, wherein the second tuner comprises an out-of-band tuner for tuning out-of-band data, and wherein the third tuner comprises a cable modem tuner; and
   a wideband low noise amplifier disposed between the diplexer output and the splitter input.

2. The apparatus according to claim 1, wherein the splitter comprises a transformer having a primary winding and a secondary winding, with center taps for both the primary winding and the secondary winding, the center taps being connected together and grounded through a capacitor, and wherein the primary winding serves as the splitter input and the secondary winding serves as the splitter outputs, with a first end of the primary winding being grounded and a first end of the secondary winding serving as the first output and the second end of the secondary winding serving as the second output.

3. The apparatus according to claim 2, further comprising a filter disposed between the amplifier and the splitter.

4. The apparatus according to claim 3, wherein the filter comprises a high pass filter.

5. The apparatus according to claim 4, wherein the high pass filter has a pass band starting at a frequency less than 54 Mhz.

6. The apparatus according to claim 1, further comprising a filter disposed between the diplexer input and the combiner.

7. The apparatus according to claim 6, wherein the filter comprises a low pass filter.

8. The apparatus according to claim 7, wherein the low pass filter has a bandwidth of approximately 42 Mhz.

9. The apparatus according to claim 6, wherein the filter comprises a bandpass filter.

10. The apparatus according to claim 9, wherein the filter has a pass band between 5 Mhz and 42Mhz.

11. The apparatus according to claim 1, wherein the first tuner tunes to signals between 54 Mhz and 860 Mhz.

12. The apparatus according to claim 1, wherein the second tuner tunes to signals between 70 Mhz and 130 Mhz.

13. The apparatus according to claim 1, wherein the third tuner tunes to signals between 88 MHz and 860 Mhz.

14. The apparatus according to claim 1, wherein the oat-of-band modem operates between 5 Mhz and 42 Mhz.

15. The apparatus according to claim 1, wherein the cable modem operates between 5 Mhz and 42 Mhz.

16. The apparatus according to claim 1, further comprising a filter disposed between the diplexer and the splitter.

17. The apparatus according to claim 16, wherein the filter comprises a high pass filter.

18. An apparatus for combining upstream and downstream signals in a television Set-Top Box, comprising:
   a cable interface for interfacing to a cable television cable;
   a diplexer coupled to the television cable interface at a diplexer port, the diplexer having a diplexer input for receiving upstream signals and a diplexer output for providing downstream signals;
   a wideband low noise amplifier receiving the downstream signals from the diplexer to produce, an amplified output;
   a high pass filter, having a pass baud above 54 Mhz, receiving the amplified output and producing a high pass filtered output;
   a combiner having an output, and having a first input receiving a first output from an out-of-band modem output, end having a second input receiving a second output from a cable modem output;
   a low pass filter receiving the combiner output and providing a low pass filtered output to the diplexer input;
   a splitter having an input receiving the high pass filtered output, and having a first output providing signals to an inband tuner, and having a second output providing signals to an out-of-band tuner, and having a third output providing signals to a cable modem tuner;
   wherein the splitter comprises a transformer having a primary winding and a secondary winding, wit center taps for both the primary winding and the secondary winding, the center taps being connected together and grounded through a capacitor, and wherein the primary winding serves as the splitter input and the secondary winding serves as the splitter outputs, with a first end of the primary winding being grounded and a first end of the secondary winding serving as the first output and the second end of the secondary winding serving as the second output;

wherein the low pass filter has a bandwidth of approximately 42 Mhz;

wherein the in-band tuner tunes to signals between 54 Mhz and 860 Mhz;

wherein the out-of-band tuner tunes to signals between 70 Mhz and 130 Mhz;

wherein the cable modem tuner tunes to signals between 88 Mhz and 860 Mhz;

wherein the out-of-band modem operates between 5 Mhz and 42 Mhz; and wherein the cable modem operates between 5 Mhz and 42 Mhz.

* * * * *

UNITED STATES PATENT AND TRADEMARK OFFICE
CERTIFICATE OF CORRECTION

PATENT NO. : 7,043,750 B2  Page 1 of 1
APPLICATION NO. : 09/815100
DATED : May 9, 2006
INVENTOR(S) : Norihisa Ina It is certified that error appears in the above-identified patent and that said Letters Patent is hereby corrected as shown below:

Claims:

In Claim 14, col. 6, line 31, delete "oat" and insert -- out -- therefor.

In Claim 18, col 6, line 46, delete "," -- therefor.

In Claim 18, col. 6, line 48, delete "baud" and insert -- band -- therefor.

In Claim 18, col. 6, line 53, delete "end" and insert -- and -- therefor.

In Claim 18, col. 6, line 64, delete "wit" and insert -- with -- therefor.

Signed and Sealed this

Eleventh Day of September, 2007

JON W. DUDAS
*Director of the United States Patent and Trademark Office*